United States Patent [19]

Karpman et al.

[11] Patent Number: 5,134,364
[45] Date of Patent: Jul. 28, 1992

[54] ELASTOMERIC TEST PROBE

[75] Inventors: Maurice S. Karpman; Leo M. Higgins, III, both of Austin, Tex.

[73] Assignee: Prime Computer, Inc., Natick, Mass.

[21] Appl. No.: 540,375

[22] Filed: Jun. 19, 1990

[51] Int. Cl.[5] .............................................. G01R 1/06
[52] U.S. Cl. ................................ 324/158 P; 324/72.5; 439/482; 439/86
[58] Field of Search ............... 324/158 F, 158 P, 72.5, 324/696; 439/482, 86

[56] References Cited

U.S. PATENT DOCUMENTS

| | | | |
|---|---|---|---|
| 3,375,310 | 3/1968 | Koehn | 264/139 |
| 3,832,632 | 8/1974 | Ardezzone | 324/158 P |
| 3,992,073 | 11/1976 | Buchoff et al. | 324/72.5 |
| 4,004,843 | 1/1971 | Boenning et al. | 324/72.5 |
| 4,141,951 | 2/1979 | Beckman | 264/230 |
| 4,633,176 | 12/1986 | Reimer | 324/158 P |
| 4,707,655 | 11/1987 | Kruger | 324/158 P |
| 4,943,720 | 7/1990 | Jones | 324/158 P |
| 4,993,957 | 2/1991 | Shino | 324/158 P |

OTHER PUBLICATIONS

Buchoff, L. and Puglia, D., "Solutions for Dense Packaging Challenges", PCK Elastomerics, Inc., pp. 601–611.

Buchoff, L., "Surface Mounting of Components With Elastomeric Connectors", PCK Elastomerics, Inc., *Electronics*, Jun. 1983.

Carlisle, B., "Solving Problems With Elastomeric Connectors", *Machine Design*, Nov. 24, 1983.

*Primary Examiner*—Vinh Nguyen
*Attorney, Agent, or Firm*—Wolf, Greenfield & Sacks

[57] ABSTRACT

A test probe for testing electronic circuits is provided with a flexible conductive pad disposed at the end of the test probe. The flexible conductive pad is resilient so that when it makes physical and electrical contact with an electronic circuit, it compresses and does not damage either the electrical circuit or the probe itself.

36 Claims, 1 Drawing Sheet

ELASTOMERIC TEST PROBE

BACKGROUND OF THE INVENTION

1. Field of the Invention

The present invention relates in general to the field of test probes and pertains, more particularly, to a test probe with a flexible conductive pad at the end of the test probe for testing electrical circuits.

2. Background Discussion

FIG. 1 shows an embodiment of a prior art test probe. The test probe 10 is comprised of a conductive material 12 attached to a pin 14 which is attached to the tester 16. The test probe 10 tests circuits, pads, leads, etc., by being lowered onto the device to be tested. In FIG. 1 the test probe 10 tests a circuit 18 by the conductive material 12 making contact with the circuit. This testing is performed either by a number of pins 14 attached to the tester 16 and arranged in an array or bed of nails scheme, or by having only one pin 14 attached to the tester 16. The former scheme generally is an automated process where the array of test probes attached to a tester are lowered onto a circuit and the test probes simultaneously test a number of circuits. The latter scheme generally is a manual testing process wherein the test probe tests only one point of a circuit at a time.

The problem with the prior art means for testing circuits is the hardness of the conductive material at the end of the pin. Being a solid conducting material, the end of the test probe is very hard and can damage the circuit being tested. The damage occurs due to the force applied to the circuit by the test probe which makes contact with the circuit. This problem is particularly prevalent in environments where the circuits being tested are very small and fragile.

Another problem with the prior art is that the conductive material on the end of the pin can be damaged or broken off with excessive use and force being applied to it in contacting circuits. These above mentioned problems are equally prevalent in the use of high-speed automatic test probes, and hand-held manual test probes.

A prior art method which attempted to alleviate these problems can be described in conjunction with FIG. 1. A spring is placed inside of a hollow pin 14 and attached to the conductive material 12. When the conductive material 12 contacts a circuit 18, the spring compresses, thus lessening the amount of force applied to the circuit.

Although this method alleviated some of the problems of damaged circuits, it is not a practical solution because it cannot be used for testing small circuits because this type of testing requires the use of a pin the size of a wire, which would be too small to encase a spring inside of it. In addition, this test probe did not alleviate the damage to the circuits caused by the conductive material scraping the circuit. Being a hard conductive metal, this material was prone to not only crush but to scrape circuits if the material, when in contact with the circuit, was moved along the circuit.

OBJECTS OF THE INVENTION

Accordingly, it is an object of the present invention to provide an improved test probe construction, and one which in particular eliminates the aforementioned problems.

Another object of the present invention is to provide a flexible conductive pad disposed at the end of a test probe so that upon contacting a circuit under test, the conductive pad compresses and does not damage the circuit under test or the probe itself.

Another object of the present invention is to provide an improved test probe having a flexible conductive pad disposed at the end of the probe, which, because of its compressibility, does not break or chip off at the end of the test probe.

A further object of the present invention is to provide an improved test probe having a flexible conductive pad disposed at the end of the test probe and in which the pad is resilient and able to regain its original shape once it is compressed.

Still another object of the present invention is to provide an improved test probe having a flexible conductive pad disposed at the end thereof which is capable of signal testing a variety of electronic circuits.

Another object of the present invention is to provide an improved test probe having a flexible conductive pad disposed at the end thereof and which can be constructed in a variety of shapes and sizes to meet the needs of differing applications.

Still another object of the present invention is to provide an improved test probe in accordance with the preceding objects and which is particularly characterized by essentially eliminating all damage to the circuits being tested as well as minimizing damage to the test probe itself.

SUMMARY OF THE INVENTION

To accomplish the foregoing and other objects, features and advantages of the invention, there is provided a test probe for the testing of electronic circuits. The test probe is comprised of means defining an elongated pin member that is constructed of rigid metal material that is electrically conductive. A flexible conductive pad means is formed at the bottom of the pin member for cushioning physical and electrical contact between the test probe and the electronic circuit. The pad means is constructed of an elastomeric material. Means are provided for integrally supporting the flexible conductive pad from the pin member. The test probe may be used for measuring voltage and current of an electric circuit which it contacts. The elastomeric material may be a combination of a conductive material and a non-conductive resilient material.

Also, in accordance with a further aspect of the present invention, there is provided a method of manufacture of a test probe. This method includes providing an elongated rigid pin member, liquifying an elastomeric material in which the elastomeric material has electrically conductive properties. Immersing the pin member in the liquified elastomeric material, withdrawing the pin with the elastomeric material at its end being disposed thereat. The final step is allowing the elastomeric material to harden at the end of the pin member to thus form a conductive pad for testing electronic circuits or devices. The liquifying of the elastomeric material is preferably performed by heating a solid elastomeric material. The step of hardening of the elastomeric material may be performed by cooling the elastomeric material.

BRIEF DESCRIPTION OF THE DRAWINGS

Numerous other objects, features and advantages of the invention should now become apparent upon a reading of the following detailed description taken in conjunction with the accompanying drawings, in which.

DETAILED DESCRIPTION

The present invention is directed to a test probe for testing electrical circuits utilizing a flexible conductive pad for cushioning physical and electrical contact between the pad and the circuit. In a preferred embodiment the pad comprises an elastomeric material. The elastomeric material is comprised of a combination of a conductive and non-conductive resilient material, so that the pad compresses and does not damage the electrical circuit which it contacts. In addition, the smoothness of the pad of the elastomeric material prevents scraping of the electrical circuit.

The non-conductive material of the elastomeric material is a resilient material such as carbon or silicone rubber. The conductive material may be a conductor such as gold, silver, copper, or tungsten.

The flexible conductive pad is supported by a pin. In an exemplary embodiment the conductive pad is integrally attached to the pin by allowing a liquified solution of the elastomeric material to solidify on the end of the pin. In an alternative method the conductive pad and the pin are connected together by a conductive adhesive.

The size and shape of the pad vary in accordance with the application with which it is being used. In a preferred embodiment of the invention the pad is shaped like a tear drop and is only a few mils in diameter.

Figure 1:
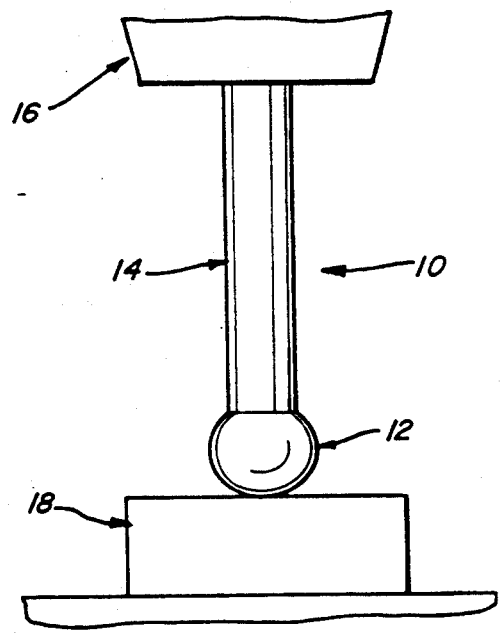
FIG. 1 is a schematic diagram of a prior art test probe.
Figure 2:
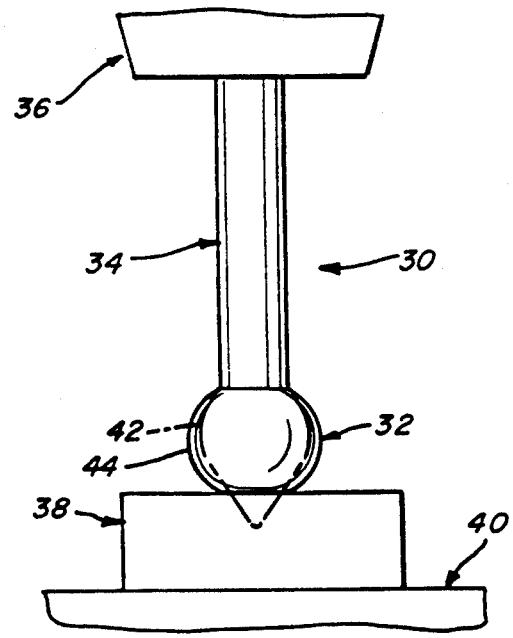
FIG. 2 illustrates the test probe of the present invention.

FIG. 2 shows a test probe constructed according to the present invention and adapted for use in testing electrical circuits. The circuits which can be tested include pads, leads, circuit boards, and other electrical circuits. In FIG. 2 an electrical circuit 38 which is mounted on a circuit board 40 is under test. Referring to FIG. 2, a test probe 30 is comprised of a flexible conductive pad 32 connected to pin 34. The test probe is connected to a tester 36. For purposes of illustration only, and not to limit the scope of the present invention, the tester 36 will be considered to be an automated mechanism which is operated automatically and can hold a large number of test probes 30 in an array or bed of nails scheme. This automated mechanism is used to simultaneously test a number of circuits. In an alternative embodiment the test probe is attached to a tester which is a hand-held device for manually testing individual circuits.

The test probe can perform a number of signal measurements on a circuit. In a preferred embodiment the test probe tests the voltage of the circuit to determine, for example, the presence or absence of shorts or opens.

In a preferred embodiment, the flexible conductive pad 32 is an elastomeric material. For purposes of illustration only, and not to limit the scope of the present invention, this pad will be considered an elastomeric material. The elastomeric material is comprised of a combination of a conductive material and a non-conductive resilient material. The non-conductive material is resilient so as to allow the pad to be compressed. Silicone rubber and graphite are materials which would work well as the non-conductive material. The conductive material can be a variety of conductors, such as gold, silver, copper, or tungsten. In a preferred embodiment the non-conductive material is silicone rubber and the conductive material is silver. To obtain optimum conductivity with the maximum possible compression, the conductive material preferably comprises 50-80% of the volume of the elastomeric material with the non-conductive material comprising the remaining volume. The percentage of conductive material, within the above range, varies according to the conductor and non-conductor used and with the application employed. For instance, for precise electrical measurements the elastomeric material may consist of a greater percentage of conductive material than in applications where a more resilient property is more important than precise electrical measurements. In a preferred embodiment of the present invention the combination of conductive and non-conductive material will yield a hardness is a range of 40-80 durometers.

The size and shape of the flexible conductive pad may vary in accordance with the size of the test probe used and the application for which the test probe is being utilized. In a preferred embodiment the surface of the pad is curved an smooth, in order to prevent the probe from scraping the circuits which it contacts. FIG. 2 shows pad 32 shaped as a preferred tear drop. This shape also allows the test probe to contact the circuit at an angle either less than or greater than the usual 90 degree angle which the test probe forms in contacting the circuit, and still provides maximum surface contact area.

In the preferred embodiment of FIG. 2, the flexible conductive pad 32 has a diameter of approximately 8 mil. This size can vary with different applications. The diameter of the conductive pad is generally not greater than twice the diameter of the pin to which it is attached. Therefore, in the preferred embodiment, the diameter of the pin 34 is approximately 4 mil.

In the preferred embodiment of FIG. 2 the pin 10 is a piece of conductive wire. The length of the pin, measured from where it is attached to the automated mechanism 36 and the pad 32, is approximately ¼ inch. The best results are achieved with a pin of short length, which results in a lower resistance. The pin may be composed of a conductive material. In the preferred embodiment pin 34 is composed of tungsten. Tungsten is used because of its durability and its low resistance.

Figure 3:
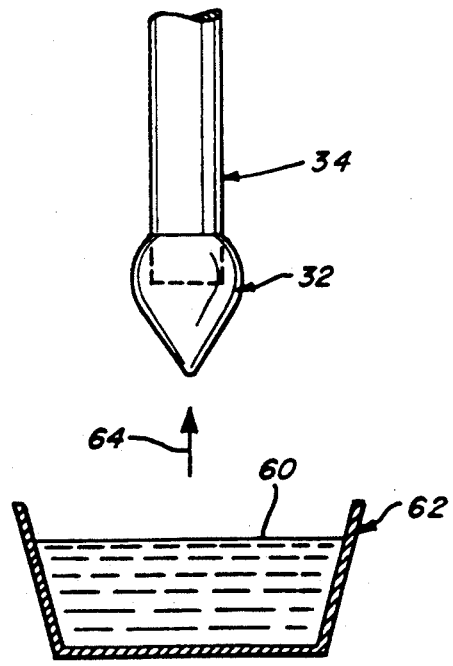
FIG. 3 illustrates one of the steps in the method of construction of the test probe in accordance with the present invention.

FIG. 3 shows one step in accordance with the method of manufacture of a test probe in accordance with the present invention. This shows in particular the step involved in forming and affixing the conductive pad onto the end of the pin. An elastomeric solution is brought to its liquified state 60, for example by heating the elastomer, and the solution is contained in a vat 62. The pin 34 is lowered into the elastomeric solution 60 and then raised as indicated by arrow 64. The elastomeric solution forms a tear drop shape at the end of pin 34. The pin 34 and elastomeric material are allowed to cool so that the elastomer hardens o the end of the pin and becomes integrally connected to the pin. The conductive pad 32 is, thus, formed.

In accordance with the method of the present invention, the hardening of the pad 32 may be hastened by cooling. Some type of a forced cooling, preferably by forced air cooling can be employed to hasten the hardening of the conductive pad 32. Such cooling would be provided in a manner to maintain the center symmetry of the pad as illustrated in FIG. 3.

Figure 4:
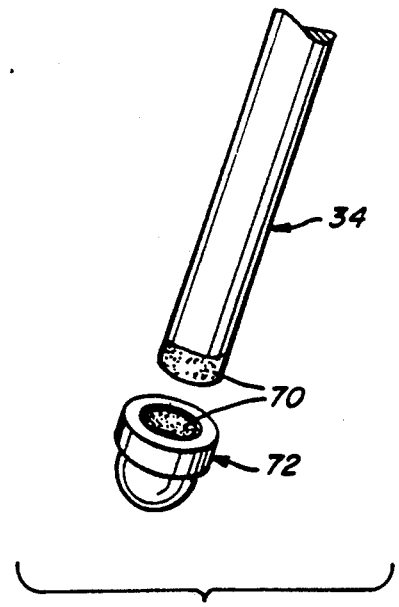
FIG. 4 is a perspective illustration of an alternate method for fastening the conductive end to the test probe.

An alternate method of constructing a test probe is illustrated in FIG. 4 herein. In this embodiment of the invention, the conductive pad 72 is formed separately and then attached to the pin 34. The conductive pad 72 is brought into contact with the end of the pin 34 and, as noted in FIG. 4, the pad 72 is hollow so as to receive the pin 34. A conductive adhesive 70 is applied to the pad and pin to thus secure the pad to the pin. The pad is secured in a manner so that when the pad makes contact with an electrical circuit, the pad remains connected to the pin both physically and electrically.

Referring to FIG. 2, the test probe 30 tests for opens and shorts on circuit 38 by the automated mechanism 36 lowering the test probe onto the circuit to be tested. The flexible conductive pad 32 of the test probe makes contact with the circuit. The contact time is of a duration which allows the automated mechanism to read the voltage or current at the point of the circuit being tested in order to check for short or open circuits. The automated mechanism exerts the minimum force on the circuit which allows the test probe to test the circuit. In a preferred embodiment this force compresses the elastomeric material a maximum of 20% of its volume. In FIG. 2, the pad 32 is shown in dotted outline in its uncompressed state and in solid outline in its compressed state. These are illustrated as respective states 42 and 44. In state 42, which would be the uncompressed state, the pad is in a tear drop shape. Upon contacting the circuit, the pad is compressed to a more spherical shape which is state 44 illustrated in FIG. 2. Upon completing the test, the automated mechanism lifts the elastomeric material from the surface of the circuit and proceeds to test another circuit. Since the pad is resilient, it regains its original shape after being compressed upon contacting the circuit.

The method of construction illustrated in FIG. 3 and in particular the tear drop type shape of the pad is important in providing proper contact with the circuit under test. With the tear drop shape, there is initially only minimum contact and this is followed by a spreading of the resilient pad 32. This shape thus minimizes abrasive contact with the circuit and thus minimizes damage to the circuit as well as minimizing any damage to the test probe itself.

Having thus described a preferred embodiment of the invention, various alterations, modifications, and improvements will readily occur to those skilled in the art. Such alterations, modifications, and improvements as are made obvious by this disclosure are intended to be part of this description though not expressly stated herein, and are intended to be within the spirit and scope of the invention. Accordingly, the foregoing description is by way of example only and is not intended as limiting. The invention is limited only as defined in the following claims and the equivalents thereto.

What is claimed is:

1. A test probe for signal testing an electronic circuit comprising:
    an elongated rigid pin member that is constructed of an electrically conductive metal material and having a free end and a longitudinal axis; and
    a flexible conductive tear drop shaped pad disposed at said free end of said pin member in alignment with the longitudinal axis of said elongated rigid pin member for cushioning physical and electrical contact between said test probe and the electronic circuit, said pad being constructed of a resilient elastomeric material.

2. A test probe as set forth in claim 1 wherein said test probe further comprises measuring means for measuring voltage and current of the electronic circuit upon contact of the electronic circuit by said flexible conductive pad.

3. A test probe as set forth in claim 1, wherein said pin comprises at least one piece of conductive wire.

4. A test probe as set forth in claim 1 wherein said flexible conductive pad is integrally molded to said pin.

5. A test probe as set forth in claim 1 wherein said flexible conductive pad is secured to said pin by a conductive adhesive.

6. A test probe as set forth in claim 1 wherein the outer diameter of said flexible conductive pad is at most twice the outer diameter of said elongated rigid pin.

7. A test probe as set forth in claim 1 wherein said elongated rigid pin extends into the interior of said flexible conductive pad to support said flexible conductive pad.

8. A test probe as set forth in claim 7 wherein said flexible conductive pad is integrally molded to said pin.

9. A test probe as set forth in claim 7 wherein said flexible conductive pad is secured to said pin by a conductive adhesive.

10. A test probe as set forth in claim 1 wherein said resilient elastomeric material has a hardness in a range of 40-80 durometers.

11. A test probe as set forth in claim 1 wherein said resilient elastomeric material comprises a non-conductive material selected from the group consisting of silicone rubber, graphite, and any combination of silicone rubber and graphite.

12. A test probe for signal testing an electronic circuit comprising:
    an elongated rigid pin member that is constructed of an electrically conductive metal material and having a free end and a longitudinal axis; and
    a flexible conductive tear drop shaped pad disposed at said free end of said pin member in alignment with the longitudinal axis of said elongated rigid pin member for cushioning physical and electrical contacts between said test probe and the electronic circuit, said pad being constructed of a resilient elastomeric material,
    wherein said elastomeric material is a combination of a conductive material and a non-conductive resilient material.

13. A test probe as set forth in claim 12 wherein said conductive material of said elastomeric material occupies 50-80% of the volume of said elastomeric material and said non-conductive material occupies the remaining volume.

14. A test probe as set forth in claim 12 wherein said non-conductive resilient material is selected from the group consisting of silicone rubber, graphite, and any combination of silicone rubber and graphite.

15. A test probe as set forth in claim 12 wherein the outer diameter of said flexible conductive pad is at most twice the outer diameter of said elongated rigid pin.

16. A test probe as set forth in claim 12 wherein said elongated rigid pine extends into the interior of said flexible conductive pad to support said flexible conductive pad.

17. A test probe as set forth in claim 16 wherein said flexible conductive pad is integrally molded to said pin.

18. A test probe as set forth in claim 16 wherein said flexible conductive pad is secured to said pin by a conductive adhesive.

19. A test probe for signal testing an electronic circuit comprising:
- an elongated rigid pin member that is constructed of an electrically conductive metal material; and
- a flexible conductive tear drop shaped pad means disposed at the free end of said pin member along the longitudinal axis of the elongated rigid pin member for cushioning physical and electrical contact between said test probe and the electronic circuit, said pad means being constructed of a resilient elastomeric material,
- wherein said elastomeric material is a combination of a conductive material and a non-conductive resilient material,
- wherein said conductive material of said elastomeric material occupies 50–80% of the volume of said elastomeric material and said non-conductive material occupies the remaining volume,
- and wherein said non-conductive material of said elastomeric material is silicone rubber.

20. A test probe for signal testing an electronic circuit comprising:
- an elongated rigid pin member that is constructed of an electrically conductive metal material and having a free end and a longitudinal axis; and
- a flexible conductive tear drop shaped pad disposed at said free end of said pin member in alignment with the longitudinal axis of said elongated rigid pin member for cushioning physical and electrical contact between said test probe and the electronic circuit, said pad being constructed of a resilient elastomeric material,
- wherein said flexible conductive pad is compressible up to 20% of its volume.

21. A test probe as set forth in claim 20 wherein said resilient elastomeric material includes conductive and non-conductive materials and wherein said conductive materials comprise electrically conductive metal pieces.

22. A test probe as set forth in claim 20 wherein said resilient elastomeric material comprises a non-conductive material selected from the group consisting of silicone rubber, graphite, and any combination of silicone rubber and graphite.

23. A test probe as set forth in claim 20 wherein the outer diameter of said flexible conductive pad is at most twice the outer diameter of said elongated rigid pin.

24. A test probe as set forth in claim 20 wherein said elongated rigid pin extends into the interior of said flexible conductive pad to support said flexible conductive pad.

25. A test probe as set forth in claim 24 wherein said flexible conductive pad is integrally molded to said pin.

26. A test probe as set forth in claim 24 wherein said flexible conductive pad is secured to said pin by a conductive adhesive.

27. A test probe as set forth in claim 1 wherein said non-conductive material is selected from the group consisting of silicone rubber, graphite, and any combination of silicone rubber and graphite.

28. A test probe for signal testing an electronic circuit comprising:
- an elongated rigid pin member that is constructed of an electrically conductive metal material; and
- a flexible conductive tear drop shaped pad means disposed at the free end of said pin member for cushioning physical and electrical contact between said test probe and the electronic circuit, said pad means being constructed of a resilient elastomeric material,
- wherein said flexible conductive pad means is compressible up to 20% of its volume,
- wherein said flexible conductive pad means is comprised of an elastomeric material including conductive and non-conductive materials and in which said conductive materials comprise electrically conductive metal pieces,
- and wherein said non-conductive material is selected from the group consisting of silicone rubber, graphite, and any combination of silicone rubber and graphite.

29. A test probe as set forth in claim 28 wherein said conductive material and said non-conductive resilient material are included in said elastomeric material in relative proportions such that said elastomeric material has a hardness in a range of 40–80 durometers.

30. A test probe as set forth in claim 28 wherein said conductive material comprises a material selected from the group consisting of gold, silver, copper, tungsten and any combination thereof.

31. A test probe as set forth in claim 28 wherein said conductive material of said elastomeric material comprises 50–80% of the volume of said elastomeric material and said non-conductive material occupies the remaining volume.

32. A test probe for signal testing an electronic circuit comprising:
- an elongated rigid pin member that is constructed of an electrically conductive metal material; and
- a flexible conductive tear drop shaped pad means disposed at the free end of said pin member for cushioning physical and electrical contact between said test probe and the electronic circuit, said pad means being constructed of a resilient elastomeric material,
- wherein said flexible conductive pad means is compressible up to 20% of its volume,
- wherein said flexible conductive pad means is comprised of an elastomeric material including conductive and non-conductive materials and in which said conductive materials comprise electrically conductive metal pieces,
- wherein said conductive material comprises silver, and
- wherein said non-conductive material comprises silicone rubber.

33. A test probe for signal testing an electronic circuit comprising:
- an elongated rigid pin member that is constructed of an electrically conductive metal material; and
- a flexible conductive tear drop shaped pad means disposed at the free end of said pin member for cushioning physical and electrical contact between said test probe and the electronic circuit, said pad means being constructed of a resilient elastomeric material,
- wherein said elastomeric material is a combination of a conductive material and a non-conductive resilient material, and wherein said non-conductive material is selected from the group consisting of silicone rubber, graphite, and any combination of silicone rubber and graphite.

34. A test probe as set forth in claim 33 wherein said conductive material and said non-conductive resilient material are included in said elastomeric material in relative proportions such that said elastomeric material has a hardness in a range of 40-80 durometers.

35. A test probe as set forth in claim 33 wherein said conductive material comprises a material selected from the group consisting of gold, silver, copper, tungsten and any combination thereof.

36. A test probe for signal testing an electronic circuit comprising:

an elongated rigid pin member that is constructed of an electrically conductive metal material; and a flexible conductive tear drop shaped pad means disposed at the free end of said pin member for cushioning physical and electrical contact between said test probe and the electronic circuit, said pad means being constructed of a resilient elastomeric material, wherein said elastomeric material is a combination of a conductive material and a non-conductive resilient material, wherein said conductive material comprises silver, and wherein said non-conductive material comprises silicone rubber.

* * * * *